US011934065B1

(12) United States Patent
Chang et al.

(10) Patent No.: US 11,934,065 B1
(45) Date of Patent: Mar. 19, 2024

(54) DISPLAY DEVICE

(71) Applicant: AUO Corporation, Hsinchu (TW)

(72) Inventors: Wan Heng Chang, Hsinchu (TW);
Min-Hsuan Chiu, Hsinchu (TW);
Syuan-Ying Lin, Hsinchu (TW);
Wei-Ming Cheng, Hsinchu (TW)

(73) Assignee: AUO Corporation, Hsinchu (TW)

( * ) Notice: Subject to any disclaimer, the term of this patent is extended or adjusted under 35 U.S.C. 154(b) by 0 days.

(21) Appl. No.: 18/331,188

(22) Filed: Jun. 8, 2023

(30) Foreign Application Priority Data

Feb. 15, 2023 (TW) ................................ 112105258

(51) Int. Cl.
*G02F 1/13357* (2006.01)
*G02F 1/133* (2006.01)
*G02F 1/137* (2006.01)

(52) U.S. Cl.
CPC .... G02F 1/133603 (2013.01); G02F 1/13306 (2013.01); G02F 1/133605 (2013.01); G02F 1/13718 (2013.01)

(58) Field of Classification Search
CPC .......... G02F 1/133603; G02F 1/13306; G02F 1/133605; G02F 1/13718
USPC ........................................................ 349/115
See application file for complete search history.

(56) References Cited

U.S. PATENT DOCUMENTS

| 11,106,102 | B2 | 8/2021 | Zhao |
| 2015/0070628 | A1 | 3/2015 | Suzuki et al. |
| 2020/0241348 | A1 | 7/2020 | Zhao |
| 2022/0358887 | A1* | 11/2022 | Liao ................. G02F 1/133618 |

FOREIGN PATENT DOCUMENTS

| CN | 109581733 | 4/2019 |
| CN | 109828416 | 5/2019 |
| CN | 112419909 | 2/2021 |

\* cited by examiner

*Primary Examiner* — Charles S Chang
(74) *Attorney, Agent, or Firm* — JCIPRNET

(57) ABSTRACT

A display device includes a substrate, a first light emitting element, a second light emitting element, and an optical film sheet. The first light emitting element and the second light emitting element are disposed on the substrate. The first light emitting element emits a first light, and the first light has a first wavelength range. The second light emitting element emits a second light, and the second light has a second wavelength range. The optical film sheet is disposed above the first light emitting element and the second light emitting element. The optical film sheet includes a first zone and a second zone. The first zone includes a first cholesteric liquid crystal, and the first cholesteric liquid crystal reflects light in at least the first wavelength range. The second zone includes a second cholesteric liquid crystal, and the second cholesteric liquid crystal reflects light in at least the second wavelength range.

19 Claims, 8 Drawing Sheets

DISPLAY DEVICE

CROSS-REFERENCE TO RELATED APPLICATION

This application claims the priority benefit of Taiwan application serial no. 112105258, filed on Feb. 15, 2023. The entirety of the above-mentioned patent application is hereby incorporated by reference herein and made a part of this specification.

BACKGROUND

Technical Field

The disclosure relates to a device, and in particular, to a display device.

Description of Related Art

With the advancement of technology, the types and applications of display devices are changing with each passing day. At present, a transparent display device has been developed, which is a display panel with a certain degree of penetration, allowing users who are located on the front side and the back side of the transparent display device to see the displayed picture through the transparent display device, and at the same time see the actual scene of the other side of the transparent display device relative to the user. However, for transparent display devices that may be viewed in two directions, since the light emitted by the self-luminous element thereof may be scattered at a large angle before being reflected to the back of the transparent display device, and the intensity of the reflected light is low, the display screen on the back is prone to image ghosting. Therefore, it is a problem to be solved at present for the front side and the back side of the transparent display device to have good display effects.

SUMMARY

The disclosure provides a display device, which may simultaneously display pictures on the front side and the back side of the display device and has good display effects.

A display device of an embodiment of the disclosure includes a substrate, a first light emitting element, a second light emitting element, and an optical film. The first light emitting element and the second light emitting element are disposed on the substrate. The first light emitting element emits a first light, and the first light has a first wavelength range. The second light emitting element emits a second light, and the second light has a second wavelength range. The optical film sheet is disposed above the first light emitting element and the second light emitting element. The optical film sheet includes a first zone and a second zone. The first zone includes a first cholesteric liquid crystal, and the first cholesteric liquid crystal reflect light in at least the first wavelength range. The second zone includes a second cholesteric liquid crystal, and the second cholesteric liquid crystal reflects light in at least the second wavelength range.

Based on the above, the display device of the disclosure includes the optical film sheet disposed above the light emitting element. The optical film sheet includes the first zone and the second zone. The first zone includes the first cholesteric liquid crystal which reflects at least the first wavelength range, and the second zone includes the second cholesteric liquid crystal which reflects at least the second wavelength range, so that a part of the light emitted by the light emitting element passing through the corresponding zone of the optical film sheet may pass through and be emitted to the front side of the display device, while another part of the light may be reflected to the back of the display device, thereby enabling both the front side and the back side of the display device to display the same image and have good display effects.

DESCRIPTION OF THE EMBODIMENTS

Figure 1A:
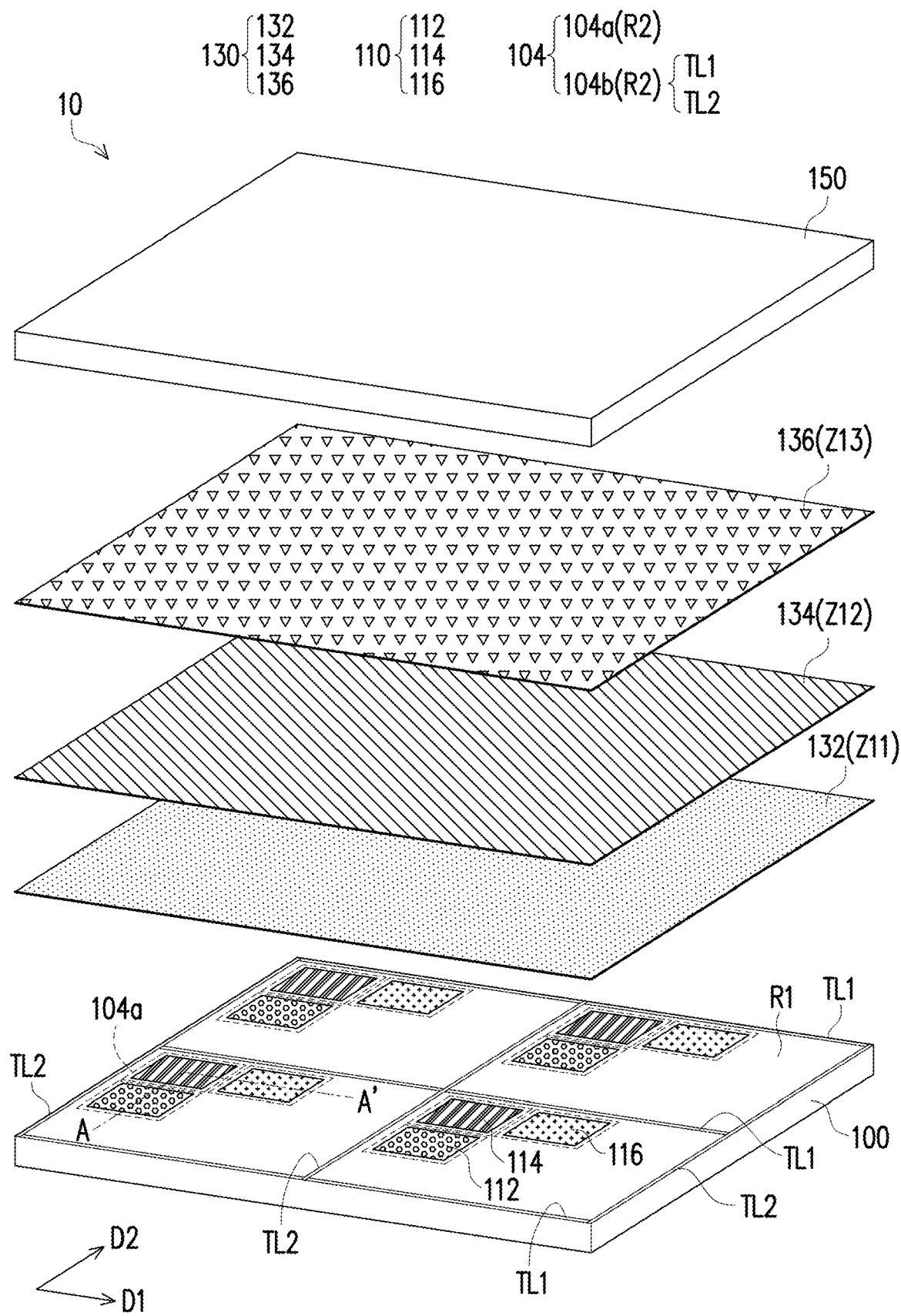
FIG. 1A is a schematic layer diagram of a display device according to an embodiment of the disclosure.

In the drawings, the thickness of layers, films, panels, regions, or the like are exaggerated for clarity. Throughout the specification, the same reference numerals denote the same elements. It will be understood that when an element such as a layer, a film, a region, or a substrate is referred to be "on" or "connected to" another element, it may be directly on or connected to the other element, or intermediate elements may also exist therebetween. In contrast, when an element is referred to be "directly on" or "directly connected to" another element, none other intermediate elements exist therebetween. As used herein, the term "connected" may refer to physical and/or electrical connection. Furthermore, the terms "electrically connected" or "coupled" may mean that other elements may exist between the two elements.

It should be understood that, although the terms "first," "second," or the like may be used herein to describe various elements, components, regions, layers, and/or portions, these elements, components, regions, and/or portions should not be limited by these terms. These terms are only used to distinguish one element, component, region, layer, or portion from another element, component, region, layer, or portion. Thus, a first "element," "component," "region," "layer" or "portion" discussed below could be termed a second element, component, region, layer, or portion without departing from the teachings herein.

Figure 1B:
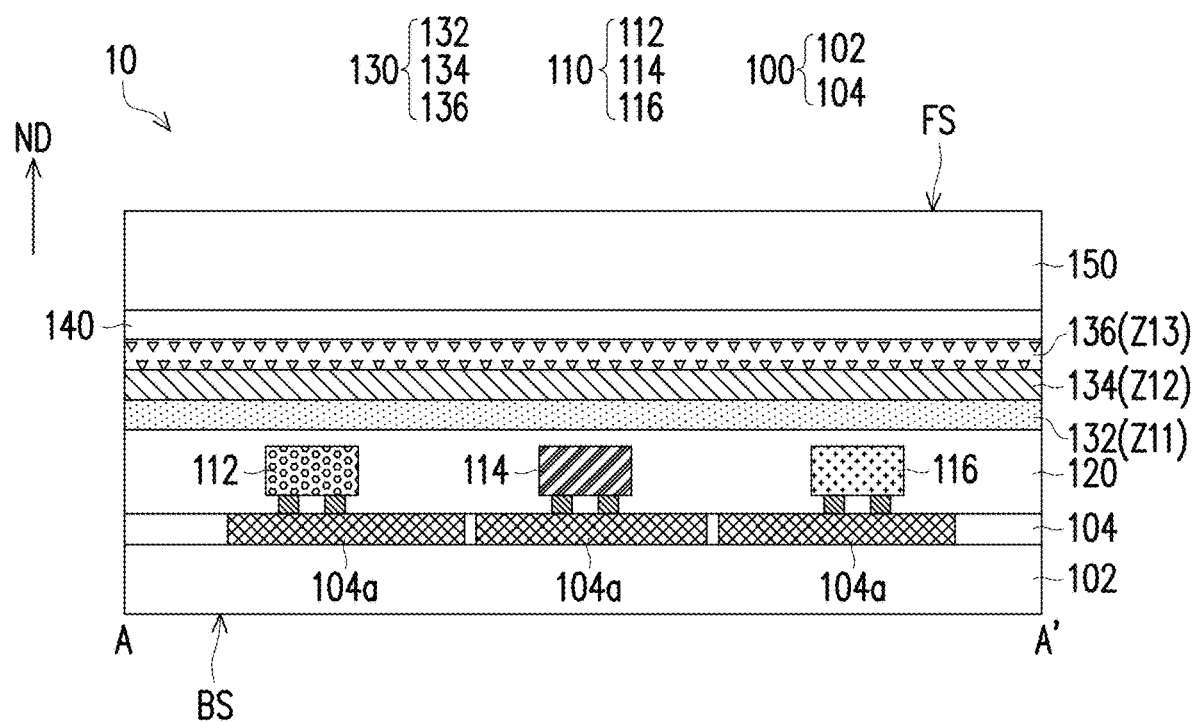
FIG. 1B is a schematic cross-sectional diagram of a display device according to an embodiment of the disclosure.

FIG. 1A is a schematic layer diagram of a display device according to an embodiment of the disclosure. FIG. 1B is a schematic cross-sectional diagram of a display device according to an embodiment of the disclosure. FIG. 1B may be a schematic cross-sectional diagram of an embodiment along a section line A-A' of FIG. 1A. For clarity, some components are omitted in FIG. 1A, and the omitted parts may be understood with reference to FIG. 1B.

Referring to FIG. 1A and FIG. 1B, a display device 10 includes a substrate 100, a light emitting element 110, and an optical film sheet 130. In the embodiment, the display device 10 further includes a protective layer 120, an adhesive layer 140, and a cover plate 150.

The display device 10 has a front side FS and a back side BS opposite to the front side FS. The substrate 100 and the cover plate 150 are disposed relative to each other. The substrate 100 is, for example, close to the back side BS of the display device 10, and the cover plate 150 is, for example, close to the front side FS of the display device 10. The light emitting element 110 is disposed on the substrate 100 and located between the substrate 100 and the cover plate 150. The protective layer 120 covers the light emitting element 110. The optical film sheet 130 is disposed on the protective layer 120 and the multiple light emitting elements 110. The adhesive layer 140 is disposed between the cover plate 150 and the optical film sheet 130 to join the cover plate 150 and the optical film sheet 130. The adhesive layer 140 may be optical glue or other suitable materials, and the disclosure is not limited thereto.

The cover plate 150 may be a transparent substrate, such as a glass substrate, a polymer substrate, or other suitable substrates. The material of the polymer substrate includes, for example, polyethylene terephthalate (PET), polycarbonate (PC), polyethylene naphthalate (PEN), or other suitable transparent polymer materials.

The substrate 100 may include a base 102 and a circuit structure 104. The base 102 may be a transparent base, such as a glass base, a polymer base, or other suitable bases. The material of the base 102 may be similar or the same as the material of the cover plate 150, and the disclosure is not limited thereto. The circuit structure 104 is disposed on the base 102 and located between the base 102 and the light emitting element 110. For example, the circuit structure 104 may include multiple driving circuit areas 104*a* and multiple wiring areas 104*b*. The multiple driving circuit areas 104*a* may be arranged along a first direction D1 or a second direction D2 crossing the first direction D1. In some embodiments, the first direction D1 may be perpendicular to the second direction D2, but not limited thereto. Each driving circuit area 104*a* may include at least one driving element (such as a thin film transistor) (not shown) and a driving circuit (not shown) to connect and drive the corresponding light emitting element 110. In FIG. 1A, the shape of the driving circuit area 104*a* is a rectangle. It should be understood that the shape of the driving circuit area 104*a* is not limited thereto and may be adjusted according to actual requirements, such as circular, trapezoidal, or any other geometric shapes. In addition, the driving circuit area 104*a* shown in FIG. 1B only schematically marks the coverage zone thereof, and the details thereof (such as having multiple circuit layers and driving elements) are omitted. The layouts of the elements and the related wirings in the driving circuit area 104*a* may be designed according to actual requirements, and the disclosure is not limited thereto.

The multiple wiring areas 104*b* are respectively connected to the corresponding driving circuit areas 104*a*. The multiple wiring areas 104*b* may include multiple first wiring zones TL1 and multiple second wiring zones TL2. The multiple first wiring zones TL1 extend in the first direction D1 and are arranged along the second direction D2. The multiple second wiring zones TL2 extend in the second direction D2 and are arranged along the first direction D1.

One or more wirings may be disposed in the multiple wiring areas 104*b* respectively, and the material of the wiring is, for example, metal, but the disclosure is not limited thereto. In other words, the wiring area 104*b* may be understood as the area where the wiring is located, and the distribution of the wiring area 104*b* may be determined from the outline of the wiring. The wiring in the wiring area 104*b* may be used to transmit signals to the corresponding driving circuit area 104*a*.

In some embodiments, the driving circuit area 104*a* and the wiring area 104*b* may surround to form multiple transmittance regions R1 of the substrate 100. The average visible light transmittance of the transmittance regions R1 is 10% to 99%, and the driving circuit area 104*a* and the wiring area 104*b* has an average visible light transmittance of smaller than 10%. That is to say, the driving circuit zone 104 *a* and the wiring zone 104 *b* are the non-transmittance regions R2 of the substrate 100 compared to the transmittance region R1. The average visible light transmittance of the transmittance region R1 may be adjusted according to practical applications, and the disclosure is not limited thereto. For example, the average visible light transmittance of the transmittance region R1 may be between 70% and 99% to be suitable for vehicle displays, but when applied to building panes, the average visible light transmittance of the transmittance region R1 may not need to be as high as a vehicle display, and it may, for example, be between 40% and 70% or other suitable ranges.

In some embodiments, the ratio of the area of the transmittance region R1 to the area of the non-transmittance region R2 is between 2:8 and 8:2, so that the user may see the actual scene of the other side of the display device 10 through the display device 10.

The light emitting element 110 is disposed on the driving circuit area 104*a* of the circuit structure 104 and connected to the corresponding driving circuit. Specifically, each light emitting element 110 overlaps the corresponding driving circuit area 104*a* in a normal direction ND of the substrate 100. In some embodiments, the coverage of the orthographic projection of the light emitting element 110 on the substrate 100 is smaller than the coverage of the orthographic projection of the driving circuit area 104*a* on the substrate 100, but the disclosure is not limited thereto.

In some embodiments, the light emitting element 110 may be a micro light emitting diode, but the disclosure is not limited thereto. The light emitting element 110 may include a first light emitting element 112, a second light emitting element 114, and a third light emitting element 116. The first light emitting element 112 may emit a first light having a first wavelength range. The second light emitting element 114 may emit a second light having a second wavelength range. The third light emitting element 116 may emit a third light having a third wavelength range. For example, the first light mainly emits light at 600 nm, and the first wavelength range thereof may be between 580 nm and 620 nm; the second light mainly emits light at 550 nm, and the second wavelength range thereof may be between 530 nm and 570 nm; the third light mainly emits light at 450 nm, and the third wavelength range thereof may be between 430 nm and 470 nm. That is to say, the first light emitting element 112, the second light emitting element 114, and the third light emitting element 116 may emit red light, green light, and blue light respectively, but the disclosure is not limited thereto. The wavelength ranges of the light emitted by the first light emitting element 112, the second light emitting element 114, and the third light emitting element 116 may be adjusted according to actual requirements.

In FIG. 1A, the first light emitting element 112, the second light emitting element 114, and the third light emitting element 116 may constitute a pixel unit. The first light emitting element 112 and the second light emitting element 114 are arranged in the second direction D2, the third light emitting element 116 is located on one side of the second light emitting element 114 and arranged in the first direction D1 with the second light emitting element 114, but the disclosure is not limited thereto. The arrangement of the first light emitting element 112, the second light emitting element 114, and the third light emitting element 116 may be adjusted according to actual requirements.

In some embodiments, the first light emitting element 112, the second light emitting element 114, and the third light emitting element 116 respectively corresponds to an independent driving circuit area 104a, but the disclosure is not limited thereto. In other embodiments, the first light emitting element 112, the second light emitting element 114, and the third light emitting element 116 may be disposed on the same driving circuit area.

FIG. 1A schematically shows four pixel units arranged in an array on the substrate 100, but it is not intended to limit the disclosure. The number and the arrangement of the pixel units may be adjusted according to actual requirements. In addition, the number, the arrangement, the wavelength range, and the layout of the corresponding driving circuit area 104a of the light emitting elements 110 in the pixel unit may be adjusted according to actual requirements, and the disclosure is not limited thereto.

The protective layer 120 may cover the top and sidewalls of the multiple light emitting elements 110 (i.e., the first light emitting element 112, the second light emitting element 114, and the third light emitting element 116), and has a substantially flat surface to facilitate bonding with other film layers. The material of the protective layer 120 may be silicone, epoxy, optically clear adhesive, or other suitable materials.

The optical film sheet 130 includes a first zone Z11, a second zone Z12, and a third zone Z13. The first zone Z11 includes a first cholesteric liquid crystal. The first cholesteric liquid crystal may reflect light in at least the first wavelength range. The second zone Z12 includes a second cholesteric liquid crystal. The second cholesteric liquid crystal may reflect light in at least the second wavelength range. The third zone Z13 includes a third cholesteric liquid crystal. The third cholesteric liquid crystal may reflect light in at least the third wavelength range. In the embodiment, the first cholesteric liquid crystal, the second cholesteric liquid crystal, and the third cholesteric liquid crystal are all in planar states, and the optical film sheet 130 is not provided with electrodes. That is, the first cholesteric liquid crystal, the second cholesteric liquid crystal, and the third cholesteric liquid crystal always maintain planar states in the display device 10 and may reflect light in a specific wavelength range.

The first zone Z11, the second zone Z12, and the third zone Z13 of the optical film sheet 130 are at least correspondingly disposed to the first light emitting element 112, the second light emitting element 114, and the third light emitting element 116. For example, the first zone Z11 overlaps the first light emitting element 112 in the normal direction ND of the substrate 100, the second zone Z12 overlaps the second light emitting element 114 in the normal direction ND of the substrate 100, and the third zone Z13 overlaps the third light emitting element 116 in the normal direction ND of the substrate 100. In this way, after the first light emitted by the first light emitting element 112 passes through the first zone Z11, a part of the first light is reflected by the first zone Z11, and another part of the first light passes through the first zone Z11. After the second light emitted by the second light emitting element 114 passes through the second zone Z12, a part of the second light is reflected by the second zone Z12, and another part of the second light passes through the second zone Z12. After the third light emitted by the third light emitting element 116 passes through the third zone Z13, a part of the third light is reflected by the third zone Z13, and another part of the third light passes through the third zone Z13. In other words, the light emitting elements 110 (such as the first light emitting element 112, the second light emitting element 114, and the third light emitting element 116) may pass through the corresponding zones of the optical film sheet 130 (such as the first zone Z11, the second zone Z12 and the third zone Z13), so that a part of the light (such as the first light, the second light, and the third light) may be emitted from the front side FS of the display device 10, and another part of the light may be reflected to the back side BS of the display device 10, thereby enabling the front side FS and the back side BS of the display device 10 to display the same image at the same time to achieve an effect of viewing the display device 10 on both sides.

In some embodiments, the driving circuit area 104a overlaps the first zone Z11, the second zone Z12, and the third zone Z13 in the normal direction ND of the substrate 100. In some embodiments, the first zone Z11, the second zone Z12, and the third zone Z13 overlap the transmittance region R1 and the non-transmittance region R2 in the normal direction ND of the substrate 100. That is to say, the coverage of the orthographic projection of the first zone Z11, the second zone Z12, and the third zone Z13 on the substrate 100 is larger than the coverage of the orthographic projection of the driving circuit area 104a on the substrate 100.

In some embodiments, the reflectance of the first cholesteric liquid crystal to the first light (or light in the first wavelength range) is between 10% and 50%, and the transmittance is between 50% and 90%; the reflectance of the second cholesteric liquid crystal to the second light (or light in the second wavelength range) is between 10% and 50%, and the transmittance is between 50% and 90%; the reflectance of the third cholesteric liquid crystal to the third light (or light in the third wavelength range) is between 10% and 50%, and the transmittance is between 50% and 90%.

In some embodiments, the area of the orthographic projection of the first zone Z11 on the substrate 100 is larger than the area of the orthographic projection of the first light emitting element 112 on the substrate 100, the area of the orthographic projection of the second zone Z12 on the substrate 100 is larger than the area of the orthographic projection of the second light emitting element 114 on the substrate 100, and the area of the orthographic projection of the third zone Z13 on the substrate 100 is larger than the area of the orthographic projection of the third light emitting element 116 on the substrate 100.

In the embodiment, the optical film sheet 130 includes a first optical film 132, a second optical film 134, and a third optical film 136. The first optical film 132 may define the first zone Z11, the second optical film 134 may define the second zone Z12, and the third optical film 136 may define the third zone Z13. That is to say, the first optical film 132 includes the first cholesteric liquid crystal which may reflect light in at least the first wavelength range, the second optical film 134 includes the second cholesteric liquid crystal which may reflect light in at least the second wavelength range, and the third optical film 136 includes the third cholesteric liquid crystal which may reflect light in at least the third wavelength range. Although it is shown in FIG. 1A that the optical film sheet 130 includes three layers of optical films (i.e., the first optical film 132, the second optical film 134, and the third optical film 136) and each optical film has a full surface pattern, it is not intended to limit the disclosure. The number of layers of the optical film sheet 130 and the patterns of each optical film layer may be adjusted according to actual requirements.

In some embodiments, the thickness of the first optical film 132 may be between 4.8 µm and 5.8 µm, the thickness of the second optical film 134 may be between 4.2 µm and 5.2 µm, and the thickness of the third optical film 136 may be between 2.7 µm and 4.1 µm. However, the disclosure is not limited thereto, and the thicknesses of the first optical film 132, the second optical film 134, and the third optical film 136 may be adjusted according to actual requirements due to different characteristics of liquid crystal materials.

In the embodiment, the first optical film 132, the second optical film 134, and the third optical film 136 are stacked sequentially from bottom to top, but the disclosure does not limit the stacking order. The stacking order may be determined according to the chromaticity and the brightness of the light emitting element 110 and be adjusted according to actual requirements. For example, if the brightness of the first light emitted by the first light emitting element 112 is relatively low, the first optical film 132 may be disposed on the bottommost layer of the optical film sheet 130 (i.e., the layer closest to the light emitting element 110 in the optical film sheet 130), so that the first light incident on the first optical film 132 does not need to pass through the second optical film 134 and the third optical film 136, and the part of the first light reflected by the first optical film 132 will also not need to pass through the second optical film 134 and the third optical film 136, so as to enable the reflected part of the first light to have the desired brightness. Conversely, if the brightness of the first light emitted by the first light emitting element 112 is relatively high, the first optical film 132 may be disposed on the topmost layer of the optical film sheet 130 (i.e., the layer farthest from the light emitting element 110 in the optical film sheet 130), so that the first light incident on the first optical film 132 needs to pass through the second optical film 134 and the third optical film 136, and the part of the first light reflected by the first optical film 132 will also need to pass through the second optical film 134 and the third optical film 134, so as to enable the reflected part of the first light to have the desired brightness. That is to say, the display device 10 may achieve a desired display effect by adjusting the stacking order of the first optical film 132, the second optical film 134, and the third optical film 136 in the optical film sheet 130.

In some embodiments, the first optical film 132 and the second optical film 134 may be connected through an adhesive layer (not shown), and the second optical film 134 and the third optical film 136 may be connected through an adhesive layer (not shown, and the disclosure is not limited thereto.

Figure 2A:
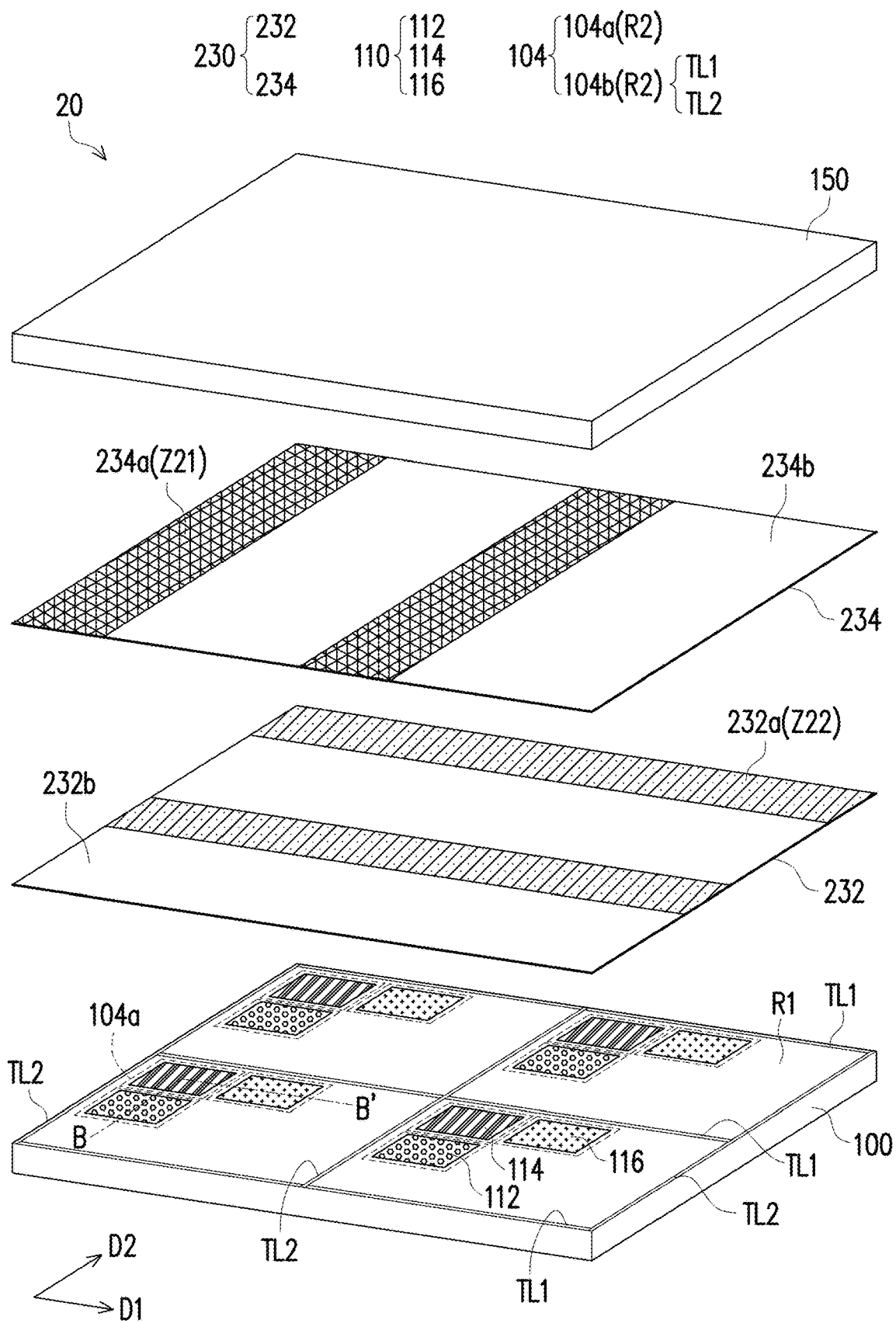
FIG. 2A is a schematic layer diagram of a display device according to another embodiment of the disclosure.
Figure 2B:
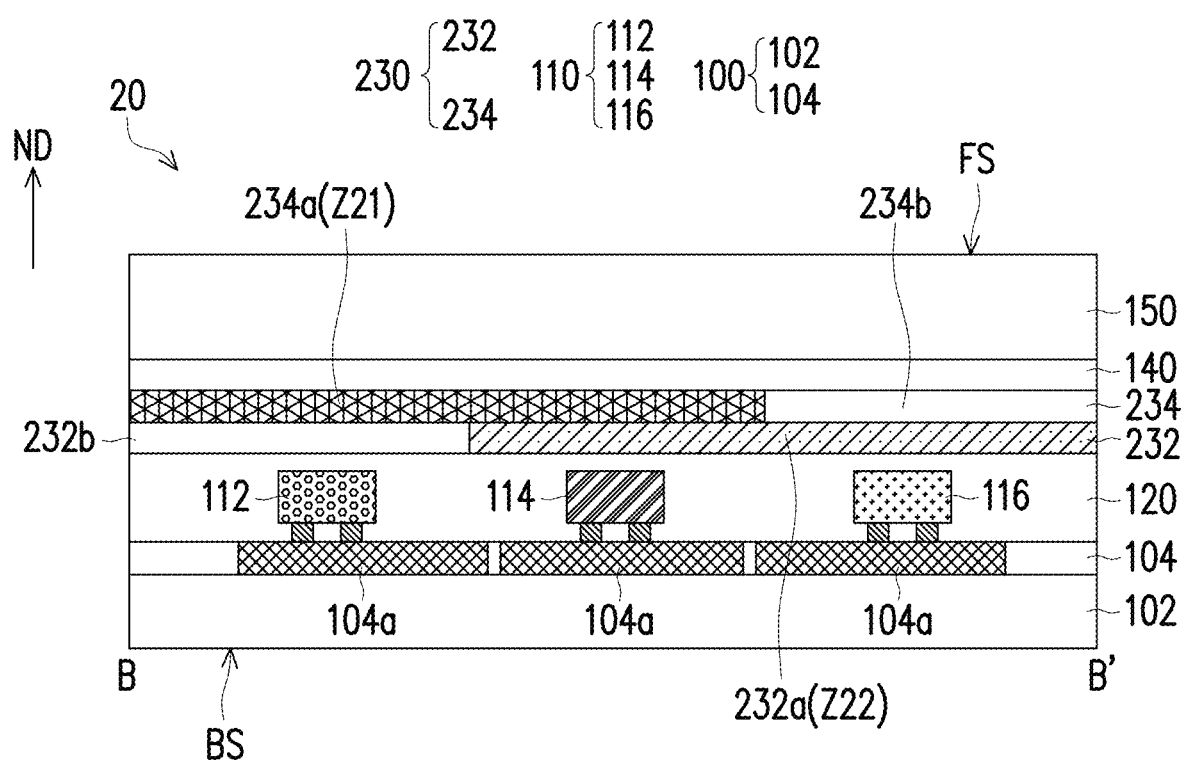
FIG. 2B is a schematic cross-sectional diagram of a display device according to another embodiment of the disclosure.

FIG. 2A is a schematic layer diagram of a display device according to another embodiment of the disclosure. FIG. 2B is a schematic cross-sectional diagram of a display device according to another embodiment of the disclosure. FIG. 2B may be a schematic cross-sectional diagram of an embodiment along a section line B-B' of FIG. 2A. For clarity, some components are omitted in FIG. 2A, and the omitted parts may be understood with reference to FIG. 2B. It must be noted here that the embodiment in FIG. 2A and FIG. 2B continues to use the referential numbers of the elements and a part of the contents of the embodiments of FIG. 1A to FIG. 1B, wherein the same or similar referential numbers are used to denote the same or similar elements, and the description of the same technical contents is omitted. For the description of the omitted part, reference may be made to the foregoing embodiments, and details are not repeated here.

Referring to FIG. 2A and FIG. 2B, the main difference between a display device 20 of the embodiment and the display device 10 is that the display device 20 includes the substrate 100, the protective layer 120, an optical film sheet 230, the adhesive layer 140, and the cover plate 150. The substrate 100, the protective layer 120, the adhesive layer 140, and the cover plate 150 are similar to the abovementioned embodiments and will not be repeated here.

The optical film sheet 230 includes a first zone Z21 and a second zone Z22. The first zone Z21 includes a first cholesteric liquid crystal, and the first cholesteric liquid crystal may reflect light in at least the first wavelength range and the second wavelength range. The second zone Z22 includes a second cholesteric liquid crystal, and the second cholesteric liquid crystal may reflect light in at least the second wavelength range and the third wavelength range. For example, the first cholesteric liquid crystal may mainly reflect light with a wavelength between 550 nm and 600 nm, and the second cholesteric liquid crystal may mainly reflect light with a wavelength between 450 nm and 550 nm, but the disclosure is not limited thereto.

In the embodiment, both the first cholesteric liquid crystal and the second cholesteric liquid crystal are in planar states, and the optical film sheet 230 is not provided with electrodes. That is, the first cholesteric liquid crystal and the second cholesteric liquid crystal always maintain planar states in the display device 20 to reflect light in a specific wavelength range. In this way, after the first light emitted by the first light emitting element 112 passes through the first zone Z21, a part of the first light is reflected by the first zone Z21, and another part of the first light passes through the first zone Z21. After the second light emitted by the second light emitting element 114 passes through the first zone Z21 or the second zone Z22, a part of the second light is reflected by the first zone Z21 or the second zone Z22, and another part of the second light passes through the first zone Z21 or the second zone Z22. After the third light emitted by the third light emitting element 116 passes through the second zone Z22, a part of the third light is reflected by the second zone Z22, and another part of the third light passes through the second zone Z22. In other words, the light emitting elements 110 (such as the first light emitting element 112, the second light emitting element 114, and the third light emitting element 116) may pass through the corresponding zones (such as the first zone Z21 and the second zone Z22) of the optical film sheet 230, so that a part of the light (such as the first light, the second light, and the third light) may be emitted from the front side FS of the display device 20, and another part of the light may be reflected to the back side BS of the display device 20, thereby enabling the front side FS and the back side BS of the display device 20 to display the same image at the same time to achieve an effect of viewing the display device 20 on both sides.

In some embodiments, the reflectance of the first cholesteric liquid crystal to the first light and the second light (or light in the first wavelength range and the second wavelength range) is between 10% and 50%, and the transmittance is between 50% and 90%; the reflectance of the second cholesteric liquid crystal to the second light and the third light (or light in the second wavelength range and the third wavelength range) is between 10% and 50%, and the transmittance is between 50% and 90%.

The first zone Z21 and the second zone Z22 of the optical film sheet 230 are at least correspondingly disposed to the first light emitting element 112, the second light emitting element 114, and the third light emitting element 116. For example, the first zone Z21 overlaps the first light emitting element 112 and the second light emitting element 114 in the normal direction ND of the substrate 100, and the second zone Z22 overlaps the second light emitting element 114 and the third light emitting element 116 in the normal direction ND of the substrate 100.

In some embodiments, the driving circuit area 104a overlaps the first zone Z21 or the second zone Z22 in the normal direction ND of the substrate 100. In some embodiments, the coverage of the orthographic projection of the first zone Z21 of the optical film sheet 230 on the substrate 100 or the coverage of the orthographic projection of the second zone Z22 on the substrate 100 is larger than the coverage of the orthographic projection of the corresponding driving circuit area 104a on the substrate 100, so that the light from the light emitting element 110 reflected by the first zone Z21 and the second zone Z22 to the back side BS of the display device 20 has good brightness, thereby improving the display effect of the back side BS of the display device 20.

In some embodiments, the area of the orthographic projection of the first zone Z21 on the substrate 100 is larger than the sum of the areas of the orthographic projections of the first light emitting element 112 and the second light emitting element 114 on the substrate 100, and the area of the orthographic projection of the second zone Z22 on the substrate 100 is larger than the sum of the areas of the orthographic projections of the second light emitting element 114 and the third light emitting element 116 on the substrate 100.

In some embodiments, the optical film sheet 230 includes a stacked first optical film 232 and a stacked second optical film 234. The first optical film 232 includes multiple first pattern parts 232a and multiple first isolation parts 232b. The multiple first pattern parts 232a and the multiple first isolation parts 232b are arranged alternately in the second direction D2, so that the first isolation parts 232b separate the multiple first pattern parts 232a. The first pattern part 232a extends in the first direction D1 and overlaps the second light emitting element 114 and the third light emitting element 116 in the normal direction ND of the substrate 100. The first isolation part 232b overlaps the first light emitting element 112 in the normal direction ND of the substrate 100, but does not overlap the second light emitting element 114 and the third light emitting element 116. The first pattern part 232a includes the second cholesteric liquid crystal. That is, the first pattern part 232a may define the second zone Z22 of the optical film sheet 230. The second optical film 234 includes multiple second pattern parts 234a and multiple second isolation parts 234b. The multiple second pattern parts 234a and the multiple second isolation parts 234b are arranged alternately in the first direction D1, so that the second isolation parts 234b separate the multiple second pattern parts 234a. The second pattern part 234a extends in the second direction D2 and overlaps the first light emitting element 112 and the second light emitting element 114 in the normal direction ND of the substrate 100. The second isolation part 234b overlaps the third light emitting element 116 in the normal direction ND of the substrate 100, but does not overlap the second light emitting element 114 and the first light emitting element 112. The second pattern part 234a includes the first cholesteric liquid crystal. That is, the second pattern part 234a may define the first zone Z21 of the optical film sheet 230. The materials of the first isolation part 232b and the second isolation part 234b may be photosensitive gap materials, spherical spacers, or other suitable gap materials, and the disclosure is not limited thereto.

Although the first optical film 232 and the second optical film 234 are shown as patterned optical films in FIGS. 2A and 2B, it is not intended to limit the disclosure. In other embodiments, the first optical film 232 and the second optical film 234 may also have full surface patterns similar to the embodiment of FIG. 1A to FIG. 1B. In addition, the stacking order of the first optical film 232 and the second optical film 234 may be adjusted according to the chromaticity and the brightness of the light emitting element 110 as described in the embodiment of FIG. 1A to FIG. 1B and according to actual requirements, and the disclosure is not limited thereto.

Figure 3A:
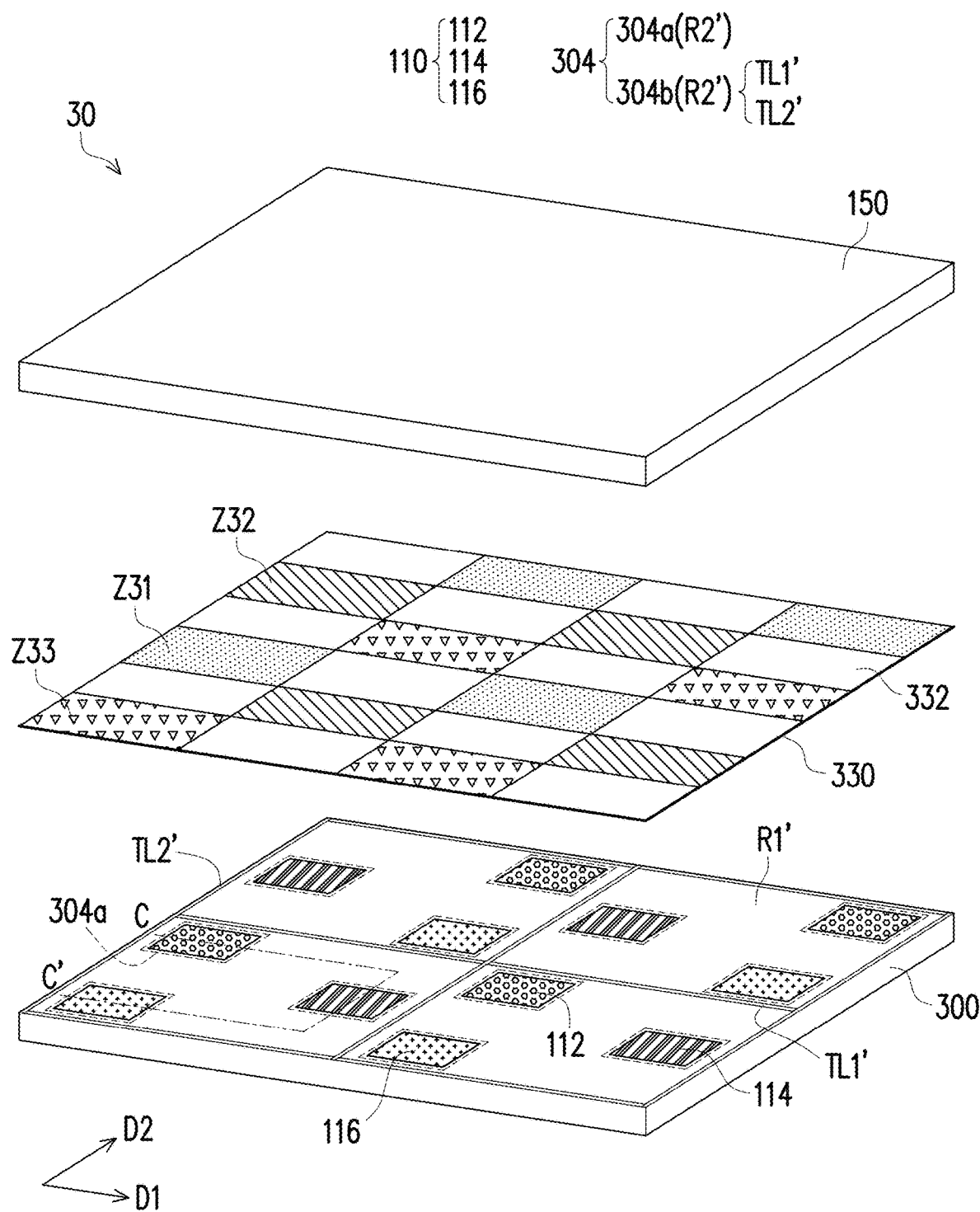
FIG. 3A is a schematic layer diagram of a display device according to another embodiment of the disclosure.
Figure 3B:
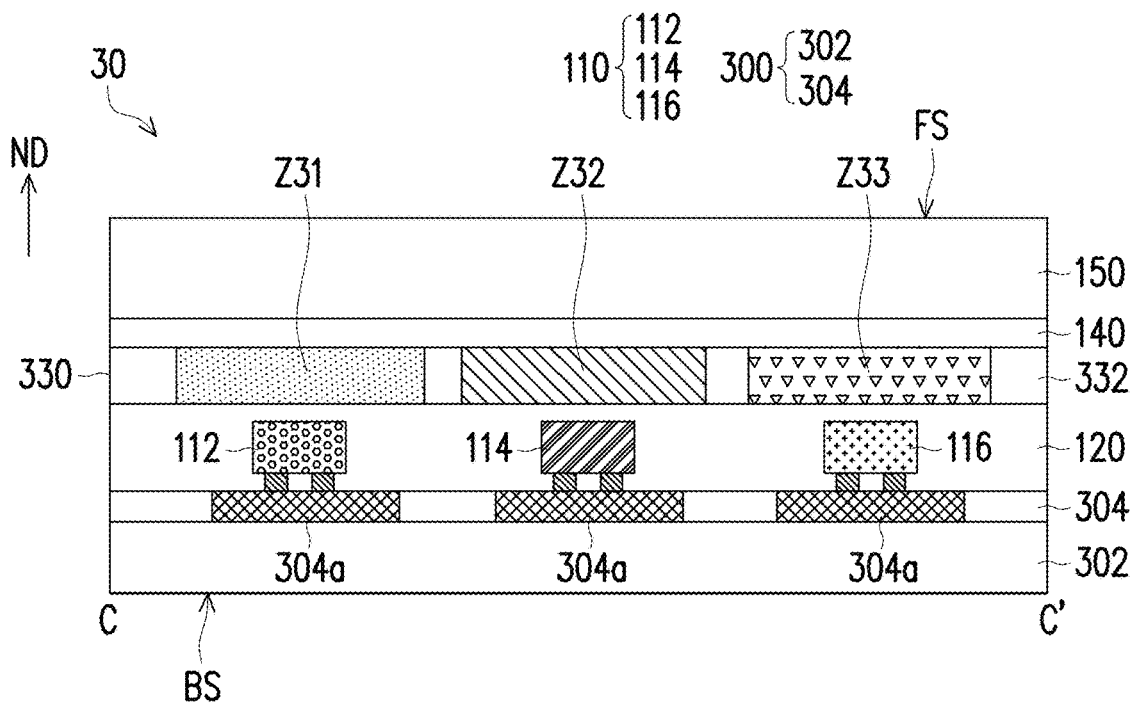
FIG. 3B is a schematic cross-sectional diagram of a display device according to another embodiment of the disclosure.
Figure 4:
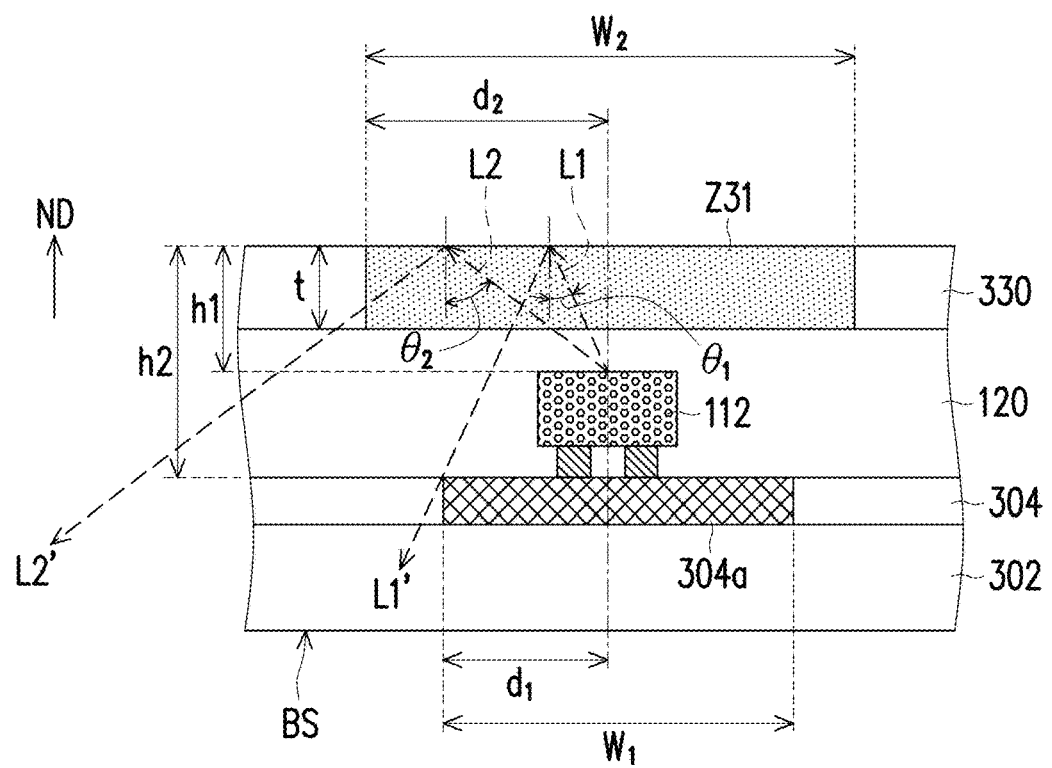
FIG. 4 is a schematic cross-sectional diagram of a display device according to another embodiment of the disclosure.

FIG. 3A is a schematic layer diagram of a display device according to another embodiment of the disclosure. FIG. 3B is a schematic cross-sectional diagram of a display device according to another embodiment of the disclosure. FIG. 3B may be a schematic cross-sectional diagram of an embodiment along a section line C-C' of FIG. 3A. FIG. 4 is a schematic cross-sectional diagram of a display device according to another embodiment of the disclosure. FIG. 4 may be a partially enlarged schematic diagram of FIG. 3B. For clarity, some components are omitted in FIG. 3A and FIG. 4, and the omitted parts may be understood with reference to FIG. 3B. It must be noted here that the embodiment in FIG. 3A to FIG. 3B and FIG. 4 continues to use the referential numbers of the elements and a part of the contents of the embodiments of FIG. 1A to FIG. 1B, wherein the same or similar referential numbers are used to denote the same or similar elements, and description of the same technical contents is omitted. For the description of the omitted part, reference may be made to the foregoing embodiments, and details are not repeated here.

Referring to FIG. 3A and FIG. 3B, the main difference between a display device 30 of the embodiment and the display device 10 is that the display device 30 includes a substrate 300, the protective layer 120, an optical film sheet 330, the adhesive layer 140, and the cover plate 150. The protective layer 120, the adhesive layer 140, and the cover plate 150 are similar to the above-mentioned embodiments and will not be repeated here.

The substrate 300 includes a base 302 and a circuit structure 304. The material of base 302 may be similar to the material of the base 102. The circuit structure 304 is disposed on the base 302. For example, the circuit structure 304 may include multiple driving circuit areas 304a and multiple wiring areas 304b. The multiple driving circuit areas 304a may be arranged in multiple rows along the first direction D1 or the second direction D2, and two adjacent rows of the driving circuit areas 304a are alternated with each other. Each driving circuit area 304a may include a driving element (such as a thin film transistor) (not shown) and a driving circuit (not shown) to connect and drive the corresponding light emitting element 110. In FIG. 3A, the shape of the driving circuit area 304a is rectangular, but the disclosure is not limited thereto, and the shape of the driving circuit area 304a may be adjusted to a desired shape according to actual requirements.

The multiple wiring areas 304b are respectively connected to the corresponding driving circuit areas 304a. The multiple wiring areas 304b may include multiple first wiring areas TL1' and multiple second wiring areas TL2'. The multiple first wiring areas TL1' extend in the first direction D1 and are arranged along the second direction D2. The multiple second wiring areas TL2' extend in the second direction D2 and are arranged along the first direction D1. One or more wirings may be disposed in the multiple wiring areas 304b respectively, and the material of the wiring is, for example, metal, but the disclosure is not limited thereto. In other words, the wiring area 304b may be understood as the area where the wiring is located, and the distribution of the wiring area 304b may be determined from the outline of the wiring. The wiring in the wiring area 304b may be used to transmit signals to the corresponding driving circuit area 304a.

In some embodiments, the driving circuit area 304a and the wiring area 304b may surround multiple transmittance regions R1' of the substrate 300. The average visible light transmittance of the transmittance regions R1' is 10% to 99%. The driving circuit area 304a and the wiring area 304b have an average visible light transmittance of smaller than 10%. That is to say, the driving circuit area 304a and the wiring area 304b are the non-transmittance regions R2' of the substrate 300 compared to the transmittance region R1'. In some embodiments, the ratio of the area of the transmittance region R1' to the area of the non-transmittance region R2' is between 2:8 and 8:2, so that the user may see the actual scene of the other side of the display device 30 through the display device 30.

The light emitting element 110 may include a first light emitting element 112, a second light emitting element 114, and a third light emitting element 116 respectively disposed on the corresponding driving circuit area 304a and connected to the corresponding driving circuit. The first light emitting element 112, the second light emitting element 114, and the third light emitting element 116 may constitute a pixel unit. In a pixel unit, the first light emitting element 112 and the third light emitting element 116 are arranged in the second direction D2, and the second light emitting element 114 is located on one side of the first light emitting element 112 and the third light emitting element 116 and is alternated with the first light emitting element 112 and the third light emitting element 116. In some embodiments, the first light emitting element 112, the second light emitting element 114, and the third light emitting element 116 respectively corresponds to an independent driving circuit area 304a. However, the disclosure is not limited thereto, and the number, the arrangement, and the wavelength range of the light emitting element 110 in the pixel unit may be adjusted according to actual requirements.

The optical film sheet 330 includes a first zone Z31, a second zone Z32, and a third zone Z33. The first zone Z31 includes a first cholesteric liquid crystal, and the first cholesteric liquid crystal may reflect light in at least the first wavelength range. The second zone Z32 includes a second cholesteric liquid crystal, and the second cholesteric liquid crystal reflect light in at least the second wavelength range. The third zone Z33 includes a third cholesteric liquid crystal, and the third cholesteric liquid crystal reflect light in at least the third wavelength range. In the embodiment, the first cholesteric liquid crystal, the second cholesteric liquid crystal, and the third cholesteric liquid crystal are all in planar states, and the optical film sheet 330 is not provided with electrodes. That is, the first cholesteric liquid crystal, the second cholesteric liquid crystal, and the third cholesteric liquid crystal always maintain planar states in the display device 30 and may reflect light in a specific wavelength range.

The first zone Z31, the second zone Z32, and the third zone Z33 of the optical film sheet 330 are at least correspondingly disposed to the first light emitting element 112, the second light emitting element 114, and the third light emitting element 116. For example, the first zone Z31 overlaps the first light emitting element 112 in the normal direction ND of the substrate 300, the second zone Z32 overlaps the second light emitting element 114 in the normal direction ND of the substrate 300, and the third zone Z33 overlaps the third light emitting element 116 in the normal direction ND of the substrate 300. In this way, after the first light emitted by the first light emitting element 112 passes through the first zone Z31, a part of the first light is reflected by the first zone Z31, and another part of the first light passes through the first zone Z31. After the second light emitted by the second light emitting element 114 passes through the second zone Z32, a part of the second light is reflected by the second zone Z32, and another part of the second light passes through the second zone Z32. After the third light emitted by the third light emitting element 116 passes through the third zone Z33, a part of the third light is reflected by the third zone Z33, and another part of the third light passes through the third zone Z33. In other words, the light emitting elements 110 (such as the first light emitting element 112, the second light emitting element 114, and the third light emitting element 116) may pass through the corresponding zones of the optical film sheet 330 (such as the first zone Z31, the second zone Z32 and the third zone Z33), so that a part of the light (such as the first light, the second light, and the third light) may be emitted from the front side FS of the display device 30, and another part of the light may be reflected to the back side BS of the display device 30, thereby enabling the front side FS and the back side BS of the display device 30 to display the same image at the same time to achieve an effect of viewing the display device 30 on both sides.

In some embodiments, the area of the orthographic projection of the first zone Z31 on the substrate 300 is larger than the area of the orthographic projection of the first light emitting element 112 on the substrate 300, the area of the orthographic projection of the second zone Z32 on the substrate 300 is larger than the area of the orthographic projection of the second light emitting element 114 on the substrate. 300, and the area of the orthographic projection of the third zone Z33 on the substrate 300 is larger than the area of the orthographic projection of the third light emitting element 116 on the substrate 300.

In the embodiment, the optical film sheet 330 is a single patterned optical film. That is, the first zone Z31, the second zone Z32, and the third zone Z33 are located in the same film layer. In addition, the first zone Z31, the second zone Z32, and the third zone Z33 are separated from each other, and the first zone Z31, the second zone Z32, and the third zone Z33 may be separated from each other by a spacer 332 (such as a photosensitive gap material, a spherical spacer, or other suitable gap materials). In some embodiments, the spacer 332 overlaps the transmittance region R1' of the substrate 300 in the normal direction ND of the substrate 300, so as to increase the transmittance of the display device 30 to visible light and improve the transparency of the display device 30.

In some embodiments, the width of each of the first zone Z31, the second zone Z32, and the third zone Z33 may be larger than the width of the corresponding driving circuit area 304a. Taking the first zone Z31 as an example, as shown in FIG. 4, since the first light emitting element 112 has a light emitting angle, the first light emitted by the first light emitting element 112 may form different incident angles with the top surface of the first zone Z31. When the incident angle is smaller than tan−1(d1/(h1+h2)), the reflected light from the first zone Z31 is easily blocked by the driving circuit area 304a, and it is difficult to emit light to the back side BS of the display device 30. When the incident angle is larger than tan−1 (d1/(h1h2)), the reflected light from the first zone Z31 will not be blocked by the driving circuit area 304a, and the light may be emitted to the back side BS of the display device 30. The aforementioned d1 is the distance between the center of the first light emitting element 112 and the side edge of the driving circuit area 304a, h1 is the distance from the top surface of the first light emitting element 112 to the top surface of the corresponding first zone Z31, and h2 is the distance from the top surface of the driving circuit zone 304a to the top surface of the corresponding first zone Z31. For example, the first light may include a first incident light L1 and a second incident light L2. The incident angle between the first incident light L1 and the top surface of the first zone Z31 is θ1, and the incident angle between the second incident light L2 and the top surface of the first zone Z31 is θ2. Here, for ease of description, the first incident light L1 and the second incident light L2 are emitted from the center of the first light emitting element 112, and the refraction of the first incident light L1 and the second incident light L2 through different film layers is not considered. Since the incident angle θ1 of the first incident light L1 is smaller than tan−1(d1/(h1+h2)), a reflected light L1' of the first incident light L1 passing through the first zone Z31 is easily blocked by the driving circuit area 304a, and it is difficult to emit light to the back side BS of the display device 30. On the other hand, since the incident angle θ2 of the second incident light L2 is larger than tan−1(d1/(h1+h2)), a reflected light L2' of the second incident light L2 passing through the first zone Z31 will not be blocked by the driving circuit area 304a, so that the light may be emitted to the back side BS of the display device 30.

It may be seen that a distance d2 between the center of the first light emitting element 112 and the side edge of the first zone Z31 (e.g., the left side of the first light emitting element 112 in FIG. 4) must be at least larger than (t+h1)*d1/(h1+h2), so that both the incident light and the reflected light of the first light may pass through the first zone Z31 and will not be blocked by the driving circuit area 304a. t is the thickness of the first zone Z31, h1 is the distance from the top surface of the first light emitting element 112 to the top surface of the corresponding first zone Z31, d1 is the distance between the center of the first light emitting element 112 and the driving circuit area 304a corresponding to the side edge of the first zone Z31, and h2 is the distance from the top surface of the driving circuit area 304a to the top surface of the corresponding first zone Z31. Preferably, when the distance d2 between the center of the first light emitting element 112 and the side edge of the first zone Z31 (e.g., the left side of the first light emitting element 112 in FIG. 4) is made to be larger than the distance d2 between the center of the first light emitting element 112 and the driving circuit area 304a corresponding to the side edge of the first zone Z31, it may be ensured that the reflected light of the first light emitting element 112 passing through the first zone Z31 may be emitted from the left side of the first light emitting element 112. On the whole, when a width W2 of the first zone Z31 is larger than a width W1 of the corresponding driving circuit area 304a, it may be ensured that the reflected light of the first light emitting element 112 passing through the first zone Z31 may be effectively emitted to the back surface BS of the display device 30. The size relationship between the first zone Z31 and the corresponding driving circuit area 304a is also applicable to other pattern zones in the optical film and is not limited to the embodiment, and may also be applicable to other embodiments described above or later.

In some embodiments, the driving circuit area 304a overlaps the first zone Z31, the second zone Z32, or the third zone Z33 in the normal direction ND of the substrate 300.

In some embodiments, the coverage of the orthographic projections of the first zone Z31, the second zone Z32, and the third zone Z33 on the substrate 300 is at least larger than the coverage of the corresponding driving circuit area 304a on the substrate 300, so that the light of the light emitting element 110 reflected by the first zone Z31, the second zone Z32, and the third zone Z33 to the back side BS of the display device 30 has good brightness, thereby improving the display effect of the back side BS of the display device 30.

Figure 5A:
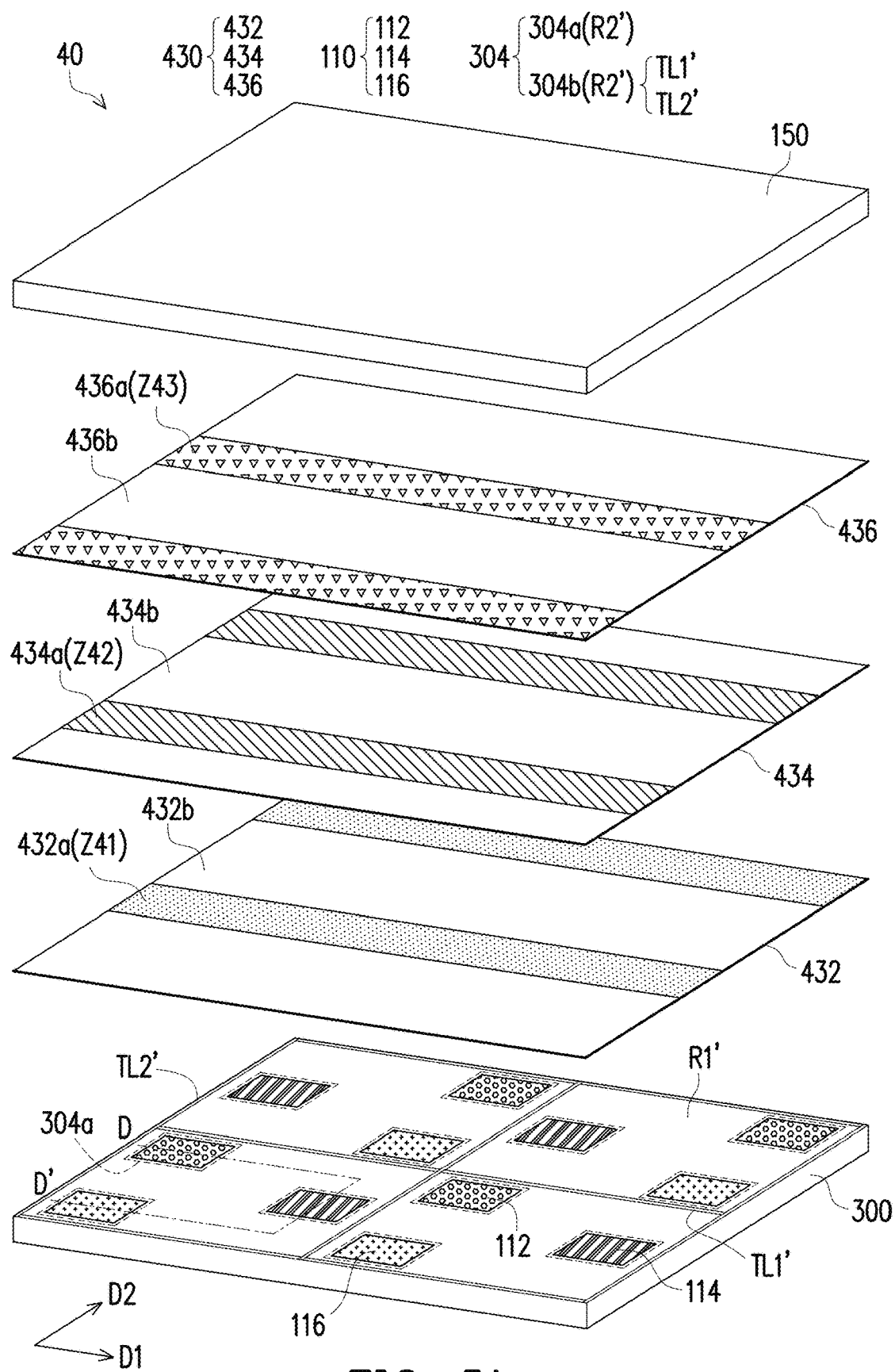
FIG. 5A is a schematic layer diagram of a display device according to another embodiment of the disclosure.
Figure 5B:
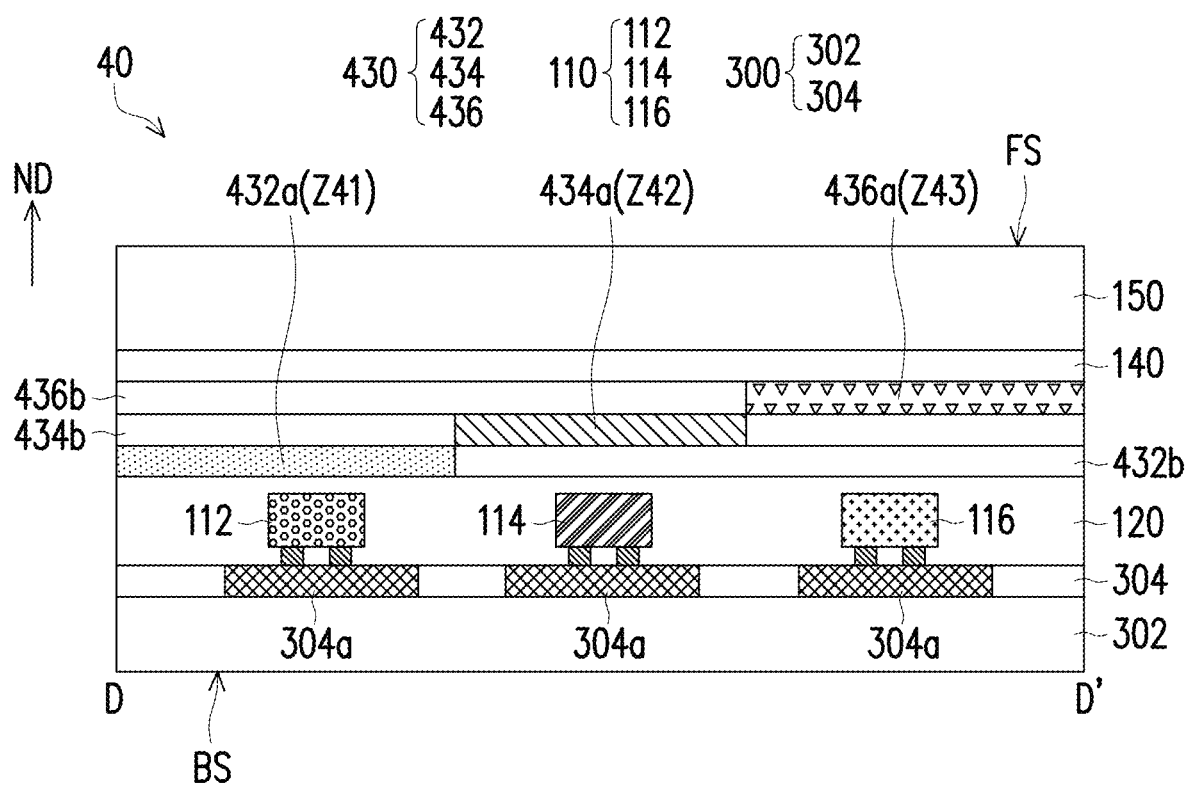
FIG. 5B is a schematic cross-sectional diagram of a display device according to another embodiment of the disclosure.

FIG. 5A is a schematic layer diagram of a display device according to another embodiment of the disclosure. FIG. 5B is a schematic cross-sectional diagram of a display device according to another embodiment of the disclosure. FIG. 5B may be a schematic cross-sectional diagram of an embodiment along a section line D-D' of FIG. 5A. For clarity, some components are omitted in FIG. 5A, and the omitted parts may be understood with reference to FIG. 5B. It must be noted here that the embodiment of FIG. 5A to FIG. 5B continues to use the referential numbers of the elements and a part of the contents of the embodiments of FIG. 3A to FIG. 3B, wherein the same or similar referential numbers are used to denote the same or similar elements, and description of the same technical contents is omitted. For the description of the omitted part, reference may be made to the foregoing embodiments, and details are not repeated here.

Referring to FIG. 5A and FIG. 5B, the main difference between a display panel 40 of the embodiment and the display device 30 is that the display panel 40 includes the substrate 300, the protective layer 120, an optical film sheet 430, the adhesive layer 140, and the cover plate 150. The substrate 300, the protective layer 120, the adhesive layer 140, and the cover plate 150 are similar to the above-mentioned embodiments and will not be repeated here.

The optical film sheet 430 includes a first zone Z41, a second zone Z42, and a third zone Z43. The first zone Z41 includes a first cholesteric liquid crystal, and the first cholesteric liquid crystal may reflect light in at least the first wavelength range. The second zone Z42 includes a second cholesteric liquid crystal, and the second cholesteric liquid crystal may reflect light in at least the second wavelength range. The third zone Z43 includes a third cholesteric liquid crystal, and the third cholesteric liquid crystal may reflect light in at least the third wavelength range. In the embodiment, the first cholesteric liquid crystal, the second cholesteric liquid crystal, and the third cholesteric liquid crystal are all in planar states, and the optical film sheet 430 is not provided with electrodes. That is, the first cholesteric liquid crystal, the second cholesteric liquid crystal, and the third cholesteric liquid crystal always maintain planar states in the display device 40 and may reflect light in a specific wavelength range.

The first zone Z41, the second zone Z42, and the third zone Z43 of the optical film sheet 430 are at least correspondingly disposed to the first light emitting element 112, the second light emitting element 114, and the third light emitting element 116. For example, the first zone Z41 overlaps the first light emitting element 112 in the normal direction ND of the substrate 300, the second zone Z42 overlaps the second light emitting element 114 in the normal direction ND of the substrate 300, and the third zone Z43 overlaps the third light emitting element 116 in the normal direction ND of the substrate 300. In this way, after the first light emitted by the first light emitting element 112 passes through the first zone Z41, a part of the first light is reflected by the first zone Z41, and another part of the first light passes through the first zone Z41. After the second light emitted by the second light emitting element 114 passes through the second zone Z42, a part of the second light is reflected by the second zone Z42, and another part of the second light passes through the second zone Z42. After the third light emitted by the third light emitting element 116 passes through the third zone Z43, a part of the third light is reflected by the third zone Z43, and another part of the third light passes through the third zone Z43. In other words, the light emitting elements 110 (such as the first light emitting element 112, the second light emitting element 114, and the third light emitting element 116) may pass through the corresponding zones of the optical film sheet 430 (such as the first zone Z41, the second zone Z42, and the third zone Z43), so that a part of the light (such as the first light, the second light, and the third light) may be emitted from the front side FS of the display device 40, and another part of the light may be reflected to the back side BS of the display device 40, thereby enabling the front side FS and the back side BS of the display device 40 to display the same image at the same time to achieve an effect of viewing the display device 40 on both sides.

In some embodiments, the area of the orthographic projection of the first zone Z41 on the substrate 300 is larger than the area of the orthographic projection of the first light emitting element 112 on the substrate 300, the area of the orthographic projection of the second zone Z42 on the substrate 300 is larger than the area of the orthographic projection of the second light emitting element 114 on the substrate. 300, and the area of the orthographic projection of the third zone Z43 on the substrate 300 is larger than the area of the orthographic projection of the third light emitting element 116 on the substrate 300.

In some embodiments, the driving circuit area 304a overlaps the first zone Z41, the second zone Z42, or the third zone Z43 in the normal direction ND of the substrate 300.

In some embodiments, the coverage of the orthographic projection of the first zone Z41, the second zone Z42, and the third zone Z43 on the substrate 300 is at least larger than the coverage of the corresponding driving circuit area 304a on the substrate 300, so that the light of the first light emitting element 110 reflected by the first zone Z41, the second zone Z42, and the third zone Z43 to the back side BS of the display device 40 has good brightness, thereby improving the display effect of the back side BS of the display device 40.

In the embodiment, the optical film sheet 430 includes a stacked first optical film 432, a stacked second optical film 434, and a stacked third optical film 436. The first optical film 432 includes multiple first pattern parts 432a and multiple first isolation parts 432b. The multiple first pattern parts 432a and the multiple first isolation parts 432b are arranged alternately in the second direction D2, so that the first isolation parts 432b separate the multiple first pattern parts 432a. The first pattern part 432a extends in the first direction D1 and overlaps the first light emitting element 112 in the normal direction ND of the substrate 300. The first isolation part 432b overlaps the second light emitting element 114 and the third light emitting element 116 in the normal direction ND of the substrate 100, but does not overlap the first light emitting element 112. The first pattern part 432a includes the first cholesteric liquid crystal. That is, the first pattern part 432a may define the first zone Z41 of the optical film sheet 430. The second optical film 434 includes multiple second pattern parts 434a and multiple second isolation parts 434b. The multiple second pattern parts 434a and the multiple second isolation parts 434b are arranged alternately in the second direction D2, so that the second isolation parts 434b separate the multiple second pattern parts 434a. The second pattern part 434a extends in the first direction D1 and overlaps the second light emitting element 114 in the normal direction ND of the substrate 300. The second isolation part 434b overlaps the first light emitting element 112 and the third light emitting element 116 in the normal direction ND of the substrate 100, but does not overlap the second light emitting element 114. The second pattern part 434a includes the second cholesteric liquid crystal. That is, the second pattern part 434a may define the second zone Z42 of the optical film sheet 430. The third optical film 436 includes multiple third pattern parts 436a and multiple third isolation parts 436b. The multiple third pattern parts 436a and the multiple third isolation parts 436b are arranged alternately in the second direction D2, so that the third isolation parts 436b separate the multiple third pattern parts 436a. The third pattern part 436a extends in the first direction D1 and overlaps the third light emitting element 116 in the normal direction ND of the substrate 300. The third isolation part 436b overlaps the first light emitting element 112 and the second light emitting element 114 in the normal direction ND of the substrate 100, but does not overlap the third light emitting element 116. The third pattern part 436a includes the third cholesteric liquid crystal. That is, the third pattern part 436a may define the third zone Z43 of the optical film sheet 430. The materials of the first isolation part 432b, the second isolation part 434b, and the third isolation part 436b may be photosensitive gap materials, spherical spacers, or other suitable gap materials, and the disclosure is not limited thereto.

In some embodiments, the first pattern part 432a, the second pattern part 434a, and the third pattern part 436a do not overlap each other in the normal direction ND of the substrate 300.

Although FIG. 5A and FIG. 5B show that the optical film sheet 430 includes three layers of optical films (i.e. the first optical film 432, the second optical film 434, and the third optical film 436) and each optical film is a patterned optical film, it is not intended to limit the disclosure. The number of layers of the optical film sheet 430 and the pattern of each optical film layer may be adjusted according to actual requirements. In addition, the stacking order of the first optical film 432, the second optical film 434, and the third optical film 436 may be adjusted according to actual requirements, and the disclosure is not limited thereto.

In summary, the display device of the disclosure includes the optical film sheet disposed above the light emitting element. The optical film sheet includes the first zone and the second zone. The first zone includes the first cholesteric liquid crystal which reflects at least a first wavelength range, and the second zone includes the second cholesteric liquid crystal which reflects at least the second wavelength range, so that a part of the light emitted by the light emitting element passing through the corresponding zone of the optical film may pass through and be emitted to the front side of the display device, while another part of the light may be reflected to the back side of the display device, thereby enabling both the front side and the back side of the display device to display the same image and have good display effects.

What is claimed is:

1. A display device, comprising:
   a substrate;
   a first light emitting element and a second light emitting element, disposed on the substrate, wherein the first light emitting element emits a first light, the first light has a first wavelength range, the second light emitting element emits a second light, and the second light has a second wavelength range;
   an optical film sheet, disposed above the first light emitting element and the second light emitting element, wherein the optical film sheet comprises a first zone and a second zone, the first zone comprises a first cholesteric liquid crystal, the first cholesteric liquid crystal reflects light in at least the first wavelength range, the second zone comprises a second cholesteric liquid crystal, and the second cholesteric liquid crystal reflect light in at least the second wavelength range, wherein:
   when the first light emits to the first zone, a part of the first light is reflected by the first zone, and an another part of the first light passes through the first zone,
   when the second light emits to the second zone, a part of the second light is reflected by the second zone, and an another part of the second light passes through the second.

2. The display device according to claim 1, wherein the first cholesteric liquid crystal and the second cholesteric liquid crystal are in planar states.

3. The display device according to claim 1, wherein the substrate has a non-transmittance region and a transmittance region, and a ratio of an area of the transmittance region to an area of the non-transmittance region is between 2:8 to 8:2.

4. The display device according to claim 1, wherein the first zone and the second zone are located in a same film layer and are separated from each other.

5. The display device according to claim 1, wherein the first zone overlaps the first light emitting element in a normal direction of the substrate, and the second zone overlaps the second light emitting element in the normal direction of the substrate.

6. The display device according to claim 5, wherein an area of an orthographic projection of the first zone on the substrate is larger than an area of an orthographic projection of the first light emitting element on the substrate, and an area of an orthographic projection of the second zone on the substrate is larger than an area of an orthographic projection of the second light emitting element on the substrate.

7. The display device according to claim 1, wherein a reflectance of the first cholesteric liquid crystal to the first light is between 10% and 50%, and a reflectance of the second cholesteric liquid crystal to the second light between 10% and 50%.

8. The display device according to claim 1, wherein the optical film sheet comprises a stacked first optical film and a stacked second optical film, at least a part of the first optical film defines the first zone, and at least a part of the second optical film defines the second zone.

9. The display device according to claim 8, wherein the first optical film comprises a pattern part corresponding to the first light emitting element and an isolation part not overlapping the first light emitting element, and the pattern part defines the first zone.

10. The display device according to claim 1, further comprising:
    a third light emitting element, disposed on the substrate, wherein the third light emitting element emits a third light, and the third light has a third wavelength range.

11. The display device according to claim 10, wherein the optical film sheet further comprises a third zone, the third zone overlaps the third light emitting element in a normal direction of the substrate, the third zone comprises a third cholesteric liquid crystal, and the third cholesteric liquid crystal reflects light in at least the third wavelength range.

12. The display device according to claim 10, wherein the first cholesteric liquid crystal reflects light in the first wavelength range and the second wavelength range, and the second cholesteric liquid crystal reflects light in the second wavelength range and the third wavelength range.

13. The display device according to claim 12, wherein the first zone overlaps the first light emitting element and the second light emitting element in a normal direction of the substrate, and the second zone overlaps the second light emitting element and the third light emitting element in the normal direction of the substrate.

14. The display device according to claim 1, wherein the substrate comprises a circuit structure, the circuit structure has a driving circuit area, the first light emitting element is located on the driving circuit area to be connected to the circuit structure correspondingly, and the driving circuit area overlaps the first zone in a normal direction of the substrate.

15. The display device according to claim 14, wherein a width of the first zone is larger than a width of the driving circuit area.

16. The display device according to claim 14, wherein an angle of an incident angle of the first light incident on the first zone is larger than $\tan^{-1}(d1/(h1+h2))$, d1 is a distance between a center of the first light emitting element and a side edge of the driving circuit area, h1 is a distance from a top surface of the first light emitting element to a top surface of the corresponding first zone, h2 is a distance from a top surface of the driving circuit area to the top surface of the corresponding first zone.

17. The display device according to claim 14, wherein a distance between a center of the first light emitting element and a side edge of the first zone is at least larger than $(t+h1)*d1/(h1+h2)$, t is a thickness of the first zone, d1 is a distance between the center of the first light emitting element and the driving circuit area corresponding to the side edge of the first zone, h1 is a distance from a top surface of the first light emitting element to a top surface of the corresponding first zone, h2 is a distance from a top surface of the driving circuit area to the top surface of the corresponding first zone.

18. The display device according to claim 1, wherein:
    the part of the first light reflected by the first zone passes through the substrate and emits from a back side of the display device,
    the another part of the first light passing through the first zone emits from a front side of the display device, wherein the front side is opposite to the back side,
    the part of the second light reflected by the second zone passes through the substrate and emits from the back side of the display device, and
    the another part of the second light passing through the second zone emits from the front side of the display device.

19. A display device, comprising:
    a substrate;
    a first light emitting element and a second light emitting element, disposed on the substrate, wherein the first light emitting element emits a first light, the first light has a first wavelength range, the second light emitting element emits a second light, and the second light has a second wavelength range;

an optical film sheet, disposed above the first light emitting element and the second light emitting element, wherein the optical film sheet comprises a first zone and a second zone, the first zone comprises a first cholesteric liquid crystal, the first cholesteric liquid crystal reflects light in at least the first wavelength range, the second zone comprises a second cholesteric liquid crystal, and the second cholesteric liquid crystal reflect light in at least the second wavelength range, wherein the first cholesteric liquid crystal and the second cholesteric liquid crystal are always in planar states.

* * * * *